United States Patent [19]

Sonetaka

[11] Patent Number: 5,944,849
[45] Date of Patent: *Aug. 31, 1999

[54] METHOD AND SYSTEM CAPABLE OF CORRECTING AN ERROR WITHOUT AN INCREASE OF HARDWARE

[75] Inventor: Noriyoshi Sonetaka, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/494,690

[22] Filed: Jun. 26, 1995

[30] Foreign Application Priority Data

Jun. 25, 1994 [JP] Japan .................................. 6-166400

[51] Int. Cl.$^6$ .................................................. H03M 13/12
[52] U.S. Cl. ........................................ 714/786; 714/795
[58] Field of Search ................... 371/43, 43.1; 714/786, 714/795

[56] References Cited

U.S. PATENT DOCUMENTS 4,945,549  7/1990  Simon et al. .............................. 375/53
5,436,918  7/1995  Kato et al. ................................. 371/43
5,442,646  8/1995  Chadwick et al. ........................ 371/43

OTHER PUBLICATIONS

Song et al., "An Adaptive Reduced–State Sequence Detector Utilizing the Symbol–Aided Method in the Mobile Satellite Channel", IEEE 0–7803–2140–5/95, pp. 74–75, Dec. 1995.

F.J. MacWilliams et al., "The Theory of Error–Correcting Codes", vol. 16, North–Holland Publishing Company, pp. 1–37.

Primary Examiner—Stephen M. Baker
Attorney, Agent, or Firm—Sughrue, Mion, Zinn, Macpeak & Seas, PLLC

[57] ABSTRACT

In a digital communication system including a coder and a decoder, a predefined known data signal is combined by the coder with a sequence of input signals at a predefined time interval and are subjected to convolution coding to send convolution code sequence to the decoder The decoder is supplied with the convolution code sequence as a sequence of reception codes to decode the reception codes into a sequence of decoded signals with reference to the predefined known data signal by the use of a maximum likelihood decoding method.

4 Claims, 7 Drawing Sheets

METHOD AND SYSTEM CAPABLE OF CORRECTING AN ERROR WITHOUT AN INCREASE OF HARDWARE

BACKGROUND OF THE INVENTION

This invention relates to a digital communication system which communicates a sequence of transmission signals from a transmitter (namely, a coder) to a receiver (namely, a decoder) and an error correction method used in the digital communication system A recent requirement has been directed to promotion of digitalization of communication and has given rise to hot discussion about introducing error correction into an actual system in order to improve quality of communication. Herein, it is known in the art that a very strong error correction system or a data communication system can be structured by combining a convolution coding method with a maximum likelihood decoding method.

Practically, such an error correction method is described by F. J. MacWllliams et al in "The Theory of Error-Correcting Codes" published by North-Holland Publishing Company.

In this event, the convolution coding method in a coder is for producing a sequence of convolution codes in response to a present input bit and a predetermined number of preceding input bits. The convolution codes are given by adding the present and the preceding input bits to modulus 2.

On the other hand, a Viterbi decoding method is used as the maximum likelihood decoding method in a decoder so as to decode the convolution codes given as a sequence of reception codes into a sequence of decoded signals. More specifically, the Viterbi decoding method may be considered to be executed in accordance with a trellis structure which includes a plurality of nodes connected to branches and paths formed by a combination of the branches, as well known in the art. At first, branch metrics between each of the reception codes and candidate codes are calculated at the respective branches to determine correlation values or branch metrics between each of the reception codes and the candidate codes at the respective nodes and are added to survived path metrics to calculate total path metrics at the paths. Subsequently, maximum likelihood sequences are selected at the respective nodes by comparing the total path metrics with one another and are determined to select a survived path and to detect the decoded signals.

According to the Viterbi decoding method, it is possible to correct an error or errors in the reception codes.

Herein, it is to be noted that a great amount of hardware is required in the decoder in order to decode the reception codes into the decoded signals in accordance with the maximum likelihood decision rule, and in particular, the Viterbi decoding method. Consequently, the decoder should have a path memory of a great amount of a capacity memory and becomes inevitably large in structure.

Alternatively, attempts have been also made in the Viberbi decoding method to reduce an amount of hardware and to make a decoder small in size. However, such a decoder has a disadvantage that a possibility of selecting a wrong path becomes high with a reduction of the hardware.

SUMMARY OF THE INVENTION

It is an object of this invention to provide a digital communication system which is capable of reliably correcting an error or errors without an increase of hardware.

It is another object of this invention to provide a decoder which is capable of reliably selecting a correct path without malfunction and which is small in size.

It Is still another object of this invention to provide a method which is capable of reliably correcting an error in a sequence of transmission codes on Viterbi decoding with reduced amount of memory capacity.

A method to which this invention is applicable is for use in correcting an error which occurs in a sequence of reception codes. According to an aspect of this invention, the method comprises the steps of receiving, as the reception code sequence, a sequence of coded signals which conveys a combination of a sequence of transmission signals and a predefined signal and correcting, by the use of a maximum likelihood decision rule, the error of the reception code sequence with reference to the predefined signal to reproduce the transmission signal sequence error corrected.

A data communication system to which this invention is also applicable comprises an coder operable in response to a sequence of transmission signals to produce a sequence of transmission codes and a decoder supplied with the transmission code sequence as a sequence of reception codes to produce a sequence of decoded signals representative of a reproduction of the transmission signal sequence. According to another aspect of this invention, the coder comprises combining means supplied with the transmission signal sequence and a predefined signal for combining the transmission signal sequence with the predefined signal at every predetermined transmission signals to produce a sequence of combined signals, coding means for carrying out convolution coding of the combined signal sequence to produce a sequence of convolution codes, and means for transmitting the convolution codes as the transmission code sequence to the decoder. The decoder is supplied with the transmission code sequence as a sequence of reception codes which convey the convolution code sequence and which might includes an error and comprises decoding means supplied with the reception code sequence operable in accordance with a maximum likelihood decision rule for decoding the reception code sequence into a sequence of decoded codes error corrected with reference to the predefined signal, and detecting means for detecting the transmission signal sequence from the decoded code sequence.

DESCRIPTION OF THE PREFERRED EMBODIMENTS

Figure 1:
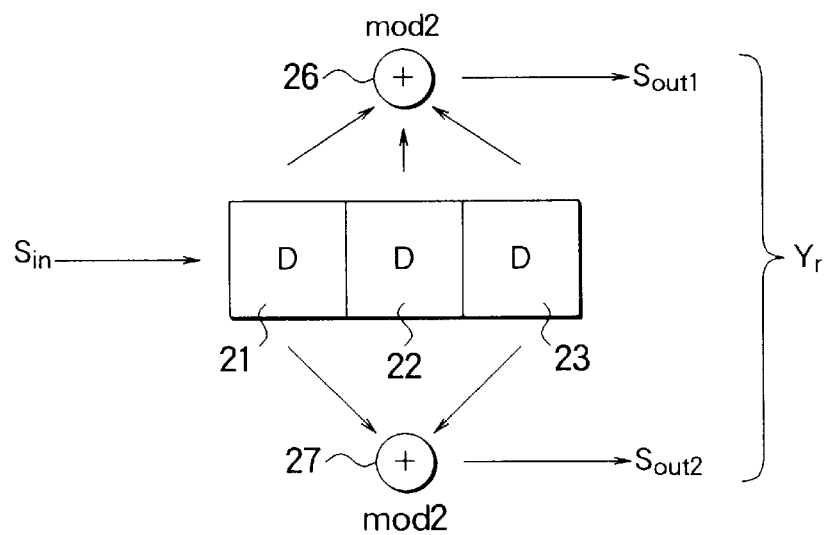
FIG. 1 is a block diagram for use in describing a conventional convolution coder.
Figure 2:
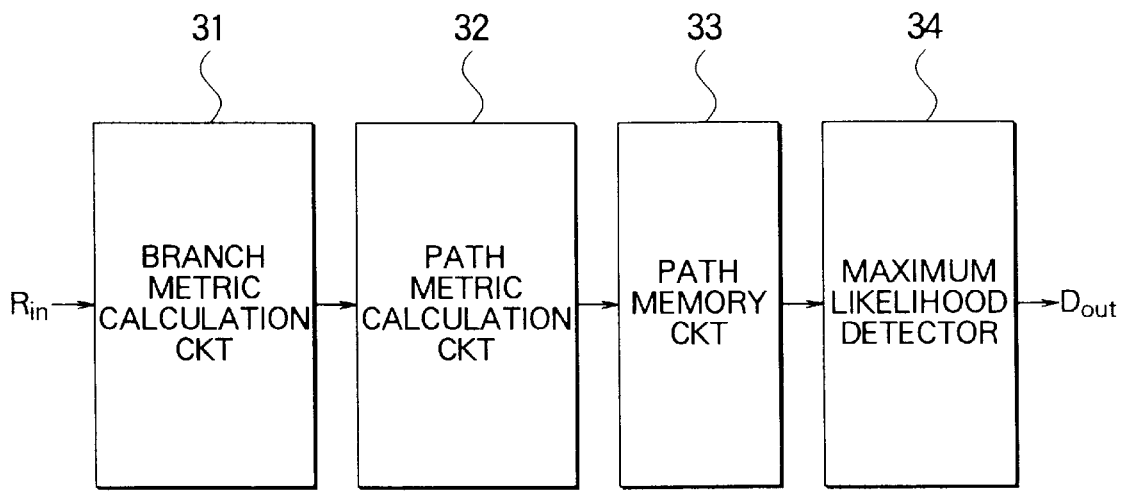
FIG. 2 is a block diagram of a conventional decoder operable in accordance with a maximum likelihood decision rule.

Referring to FIGS. 1 and 2, description will be made at first about a conventional coder and a conventional decoder both of which are used in a digital communication system to facilitate a better understanding of this invention. In FIG. 1, the coder is supplied with a sequence of input data signals or transmission signals to produce a sequence of coded signals which are subjected to convolution coding and which will be called a sequence of convolution codes. The input data signals and the convolution codes may be assumed to be represented by sequences of bits and may be therefore referred to as a sequence of input bits Sin and a sequence of convolution code bits Yr, respectively.

Herein, it is to be noted that the convolution code bits, r in number, are defined by a coding rate R and a constraint length K and that the convolution code bits, r in number, are generated by adding the input bits to modulus 2. The constraint length K is represented by a bit number of the input signals that influences the convolution code bits. On the other hand, the coding rate R is given by s/r when s bits are given as the input bits and r bits of the convolution code are produced from the adders (mod 2) 26 and 27.

For brevity of description, let consideration be made in FIG. 1 about the coding rate R and the constraint length K which are equal to ½ and 3, respectively. In this event, the conventional coder illustrated in FIG. 1 is supplied with the input bits Sin to produce the convolution code bits Yr. Thus, the convolution code bits Yr of 2 bits appears in response to the single input bit because the coding rate R is equal to ½ in this example. Therefore, the numbers s and r become equal to 1 and 2, respectively. Specifically, the convolution coder comprises first, second, and third delay units 21, 22, and 23 all of which form a shift register and first and second adders 26 and 27 both of which are adders (mod 2). The first through the third delay units 21 to 23 have delay times depicted at D in FIG. 1. The number or stage number of the delay units 21 to 23 is equal to the constraint length K and is therefore three in the illustrated example.

The first adder 26 is connected to the first through the third delay units 21, 22, and 23 to produce a first convolution code bit Sout1 while the second adder 27 is connected only to the first and the third delay units 21 to 23 to produce a second convolution code bit Sout2. The first and the second convolution code bits Sout1 and Sout2 are produced through a parallel-to-series converter (not shown) in the form of the convolution code bit sequence.

As well known in the art, the illustrated coder can be represented by a generating function which is defined by a relationship between a single one of the input bits Sin and the two convolution code bits Y1 and Y2 (collectively shown at Yr in FIG. 1) and is given by:

$Y1=1+D+D^2$ (Sout1), and $Y2=1+D$ (Sout2)

At any rate, the coder illustrated in FIG. 1 can produce the convolution code bit sequence which has the coding rate R and the constraint length K equal to ½ and 3, respectively.

In FIG. 2, the decoder is operable in accordance with the Viterbi decoding method which is used as a maximum likelihood decoding method operable in accordance with a maximum likelihood decision rule and which has a strong coding gain. The illustrated decoder is supplied from the coder shown in FIG. 1 with the convolution code bit sequence as a sequence of reception codes Rin to produce a sequence of decoded bits Dout representative of a reproduction of the input bit sequence Sin depicted in FIG. 1. Simply, the decoder can be operated in accordance with a trellis diagram which has a plurality of nodes or states, branches connected between two of the nodes, and paths formed by a combination of the branches.

As shown in FIG. 2, the illustrated decoder includes a branch metric calculation circuit 31, a path metric calculation circuit 32, a path memory circuit 33, and a maximum likelihood detector 34, all of which are operable in a known manner. At any rate, the decoder can decode the reception code sequence Rin into the decoded signal sequence Dout in accordance with the Viterbi algorithm or the maximum likelihood decision rule.

More specifically, the branch metric calculation circuit 31 is supplied with the reception bit sequence to calculate branch-metrics related to each of the reception codes. The branch metrics specify correlation values of each of the reception codes and candidate codes.

The branch metrics are added in the path metric calculation circuit 32 to previous path metrics at the respective nodes to calculate renewed path metrics. The renewed path metrics are compared with one another to select maximum likelihood paths at the respective nodes. The path memory 33 memorizes survived paths which are left until the present time at the respective states or nodes and which are renewed. The maximum likelihood detector 34 determines the decoded signal sequence from the survived paths.

Figure 3:
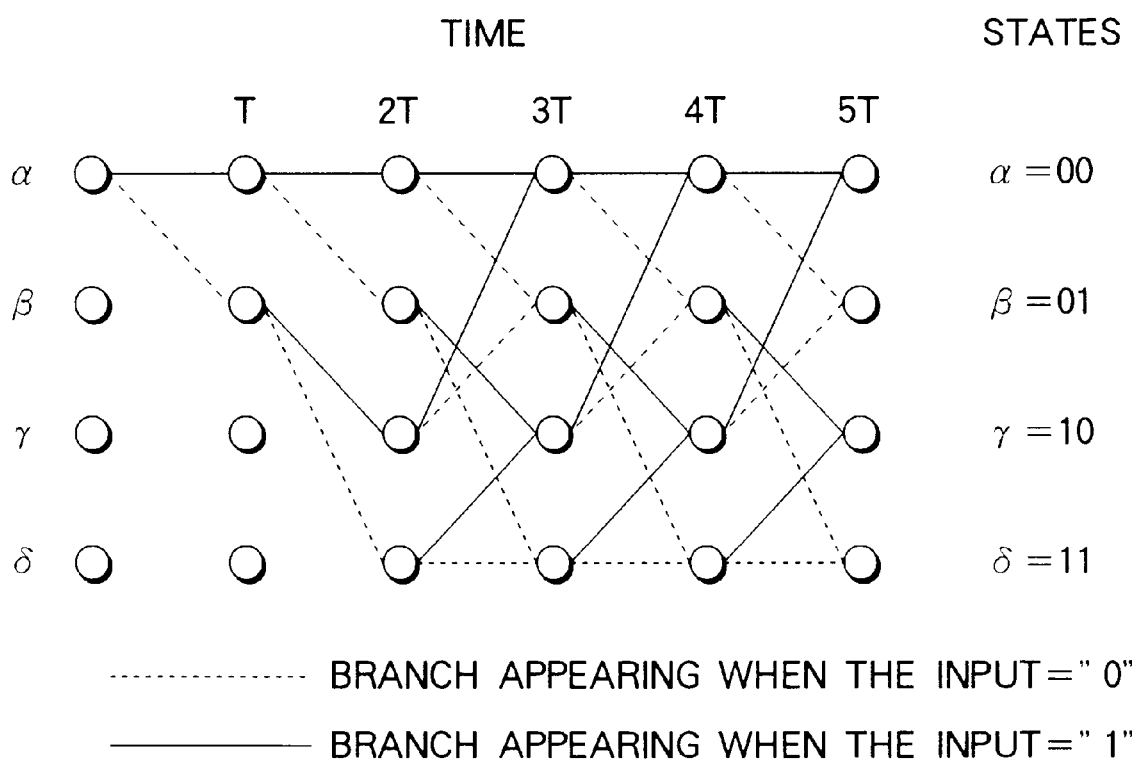
FIG. 3 is a trellis diagram for use in describing operation of a part of the conventional decoder illustrated in FIG. 2.

Herein, it is assumed that the conventional decoder shown in FIG. 2 carries out operation in accordance with a trellis diagram as illustrated in FIG. 3 and that the predetermined number of the reception codes is stored in the decoder. Under the circumstances, a plurality of paths are left at every node as survived paths and the remaining paths are discarded. This operation is carried out at all of the nodes or states in a time sequence.

In order to execute such operation, it is said that the reception codes should be memorized five or six times the constraint length K. In other words, the predetermined number of the reception codes is equal to five or six times the constraint length. This results in necessity of the path memory circuit 33 of a large memory capacity. In addition, the memory capacity of the path memory circuit 33 becomes drastically large with an increase of the constraint length K of the convolution code. Moreover, a plurality of survived paths should be memorized in the path memory circuit 33, which brings about a further increase of the memory capacity in the path memory circuit 33.

Consideration has been made about a method of reducing a memory capacity of the path memory circuit 33. To this end, let the memory capacity of the path memory circuit 33 be reduced to twice the constraint length K.

Figure 4A:
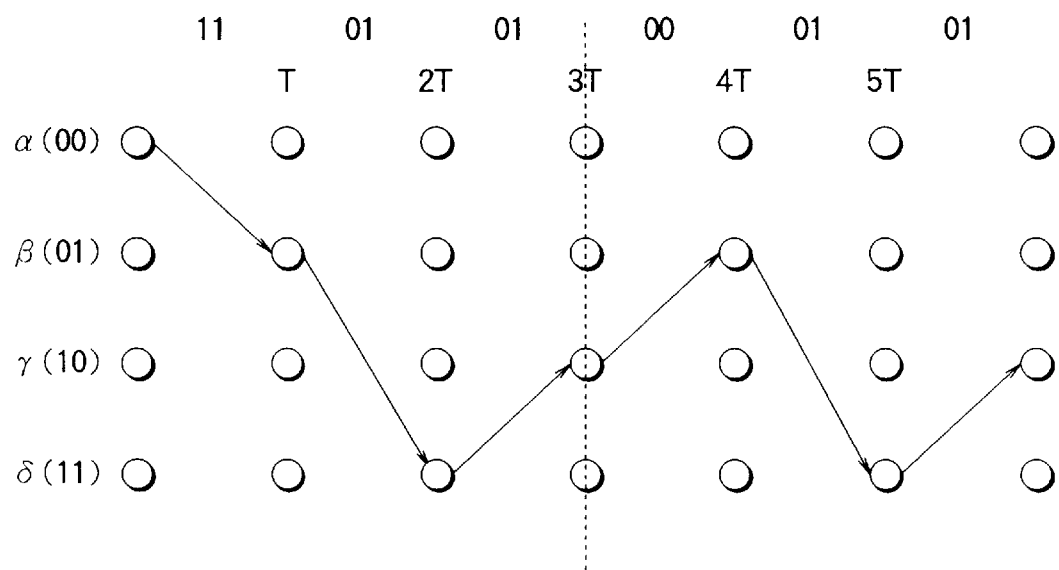
FIGS. 4(A) and (B) show trellis diagrams for use in describing another part of the conventional decoder illustrated in FIG. 2.

As illustrated in FIG. 4(A), when no transmission error takes place within six convolution codes of twelve reception bits, such as 11, 01, 01, 00, 01, and 01 which are illustrated along the top line of FIG. 4(A), the decoded codes are produced by selecting the path shown In FIG. 4(A). In this event, the states are successively changed in the order of α, β, δ, τ, β, δ, and τ.

Figure 4B:
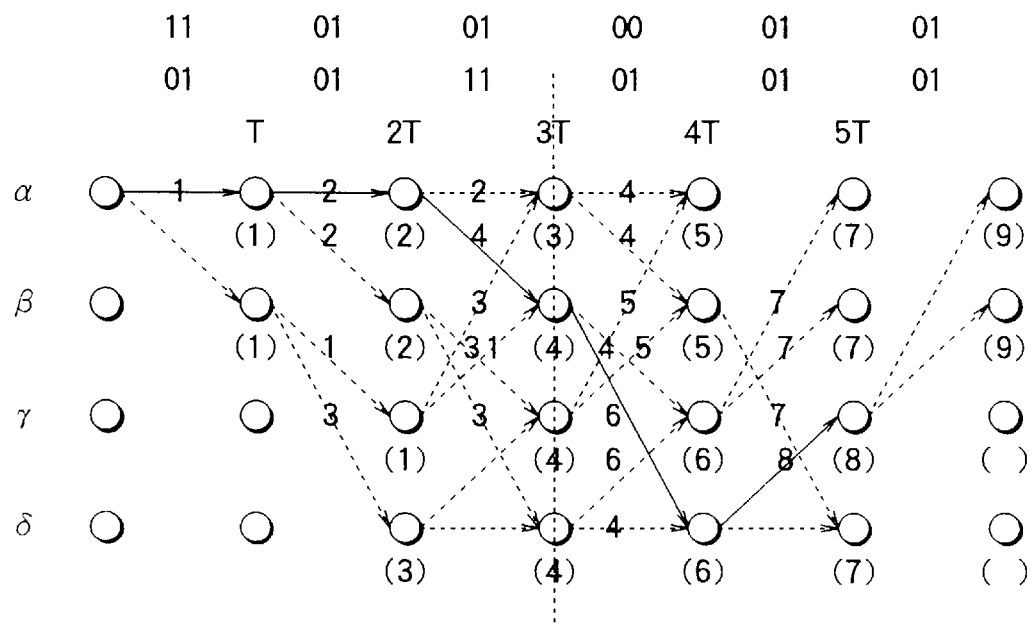

On the other hand, when the twelve reception bits include three error bits, as shown along the second line of FIG. 4(B), a selected path is allowed to pass through the successive states α, α, β, δ, and τ by successively adding the branch metrics depicted at numerical numbers on the real lines and by selecting a maximum one of the branch metrics at each time, as shown in FIG. 4(B). Thus, the selected path is selected as a maximum likelihood survived path which is completely different from the correct path illustrated in FIG. 4(A).

Figure 5:
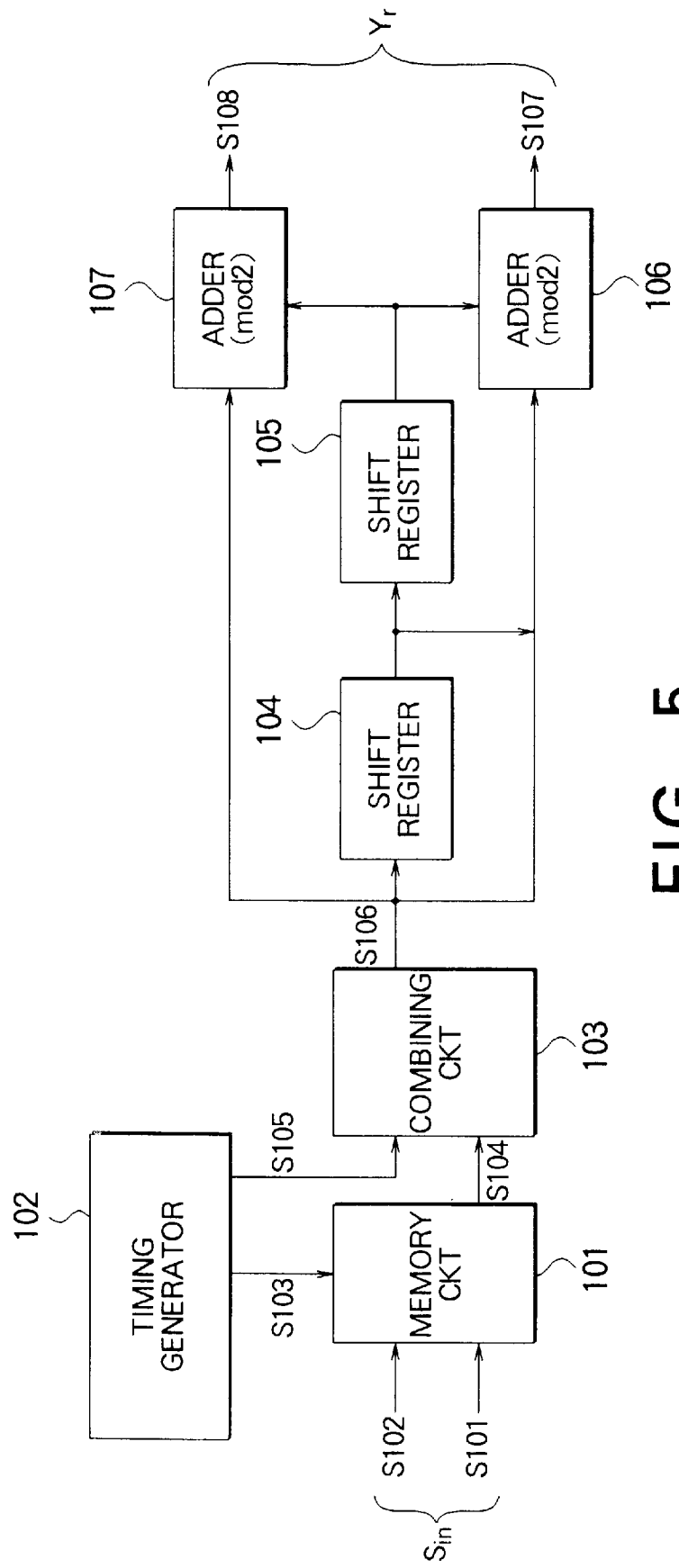
FIG. 5 is a block diagram of a coder according to an embodiment of this invention.

Thus, when the path memory circuit 33 is reduced in a memory capacity to the extent of twice the constraint length K in the conventional maximum likelihood method, a wrong path is often selected by the conventional decoder Referring to FIG. 5, a coder is used in a transmission side of a data communication system according to a preferred embodiment of this invention and carries out convolution coding operation. Specifically, the coder includes a memory circuit 101 implemented by a FIFO or an RAM, a timing generator 102, a combining circuit 103, a first shift register 104, a second shift register 105, a first adder (mod 2) 106, and a second adder (mod 2) 107. In the illustrated example, a sequence of input bits S101 is supplied to the memory circuit 101 in synchronism with a sequence of clock pulses S102. In other words, the input bits S101 are given at each bit and are therefore divided into single bits. This shows that s is equal to three in the illustrated example. A combination of the input bits S101 and the clock pulses S102 may be collectively called an input signal sequence or a transmission signal sequence.

The timing generator 102 supplies a sequence of timing pulses S103 to the memory circuit 101. In this event, a single one of the timing pulses S103 is thinned out at every (q+1)-th clock pulse, namely, at every fourth clock pulse, as shown at S103 in FIG. 6. Therefore, q is equal to three in the illustrated example. A sequence of memory output bits S104 is sent from the memory circuit 101 to the combining circuit 103 in response to the clock pulses S103 and is therefore thinned out at every fourth clock, as shown at S104 in FIG. 6. As a result, the memory output bit sequence S104 is produced from the memory circuit 101 in the form of 00, 01, 02; 03, 04, 05; 06, 07, 08, as shown in FIG. 6.

Figure 6:
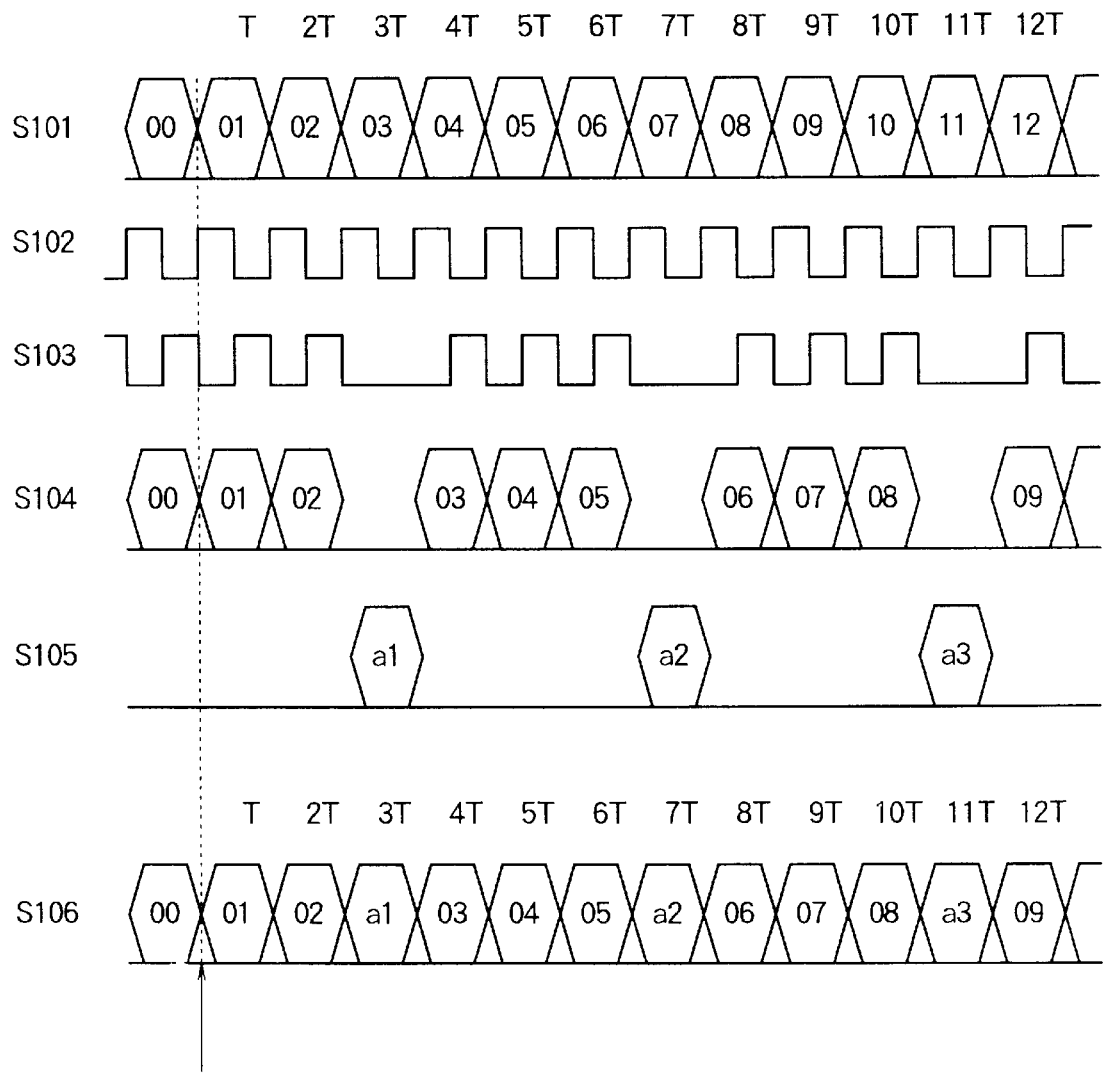
FIG. 6 is a time chart for use in describing operation of the coder illustrated in FIG. 5.

The combining circuit 103 is also supplied from the timing generator 102 with a predefined data signal S105 which appears at every fourth bit of the memory output bits S104, as shown at a1, a2, and a3 in FIG. 6, and which may be previously known by the transmitter and the receiver sides of the present invention. Therefore, a1, a2, and a3 of the predefined data signal S105 may be identical with one another or may be different from one another. Thus, the predefined data signal S105 may be composed of a sequence of bits or bit taking "0" or "1" and is inserted for three bits of the memory output bit sequence S104. Thus, the predefined data signal S105 may be composed of m bits where m is an integer equal to or greater than unity, although the predefined signal S105 is assumed to be equal to unity in the illustrated example. Therefore, the predefined data signal S105 may be called a predefined data bit.

In general, the predefined data signal S105 of m bits may be Inserted for the q bits of the memory output bit sequence S104, where q is an integer equal to or greater than unity. In this case, a pattern of m bits is predetermined and previously known by the transmission and the reception sides and each of the m bits is successively assigned to the memory output bits S104 bit by bit.

At any rate, the combining circuit 103 combines the memory output bit sequence S104 with the predefined data signal S105 to produce a sequence of combined bits S106 The combined bit sequence S106 includes the predetermined data bits equal to (s+(m×s/q)) bits and is sent to the first shift register 104 and the first and the second adders (mod 2) 106 and 107. The first adder (mod 2) 106 adds each of the combined bits S106, a first shift register output bit, and a second shift register output bit to one another to modulus 2 while the second adder (mod 2) 107 adds each of the combined bits S106 and the second shift register output bit to each other to modulus 2. From this fact, it is readily understood that the shift registers 104 and 105 and the first and the second adders (mod 2) 106 and 107 form a convolution coder which has the coding rate R of ½, the constraint length K of 1, and the unit s of 1, and the output bits of 2.

Thus, the adders (mod 2) 106 and 107 produce convolution coded bits S107 and S108, respectively, which are converted into a sequence of convolution codes Yr by a parallel-to-serial converter (not shown).

In a like manner, it is readily possible to implement a coder which carries out convolution coding at the coding rate R and the constraint length K (K=1, 2, . . . , k) by modifying the coder illustrated in FIG. 5. It is to be noted that the predefined data bit S105 may be inserted into the memory output bit sequence, regardless of the coding rate R and the constraint length K.

Figures 7, 8:
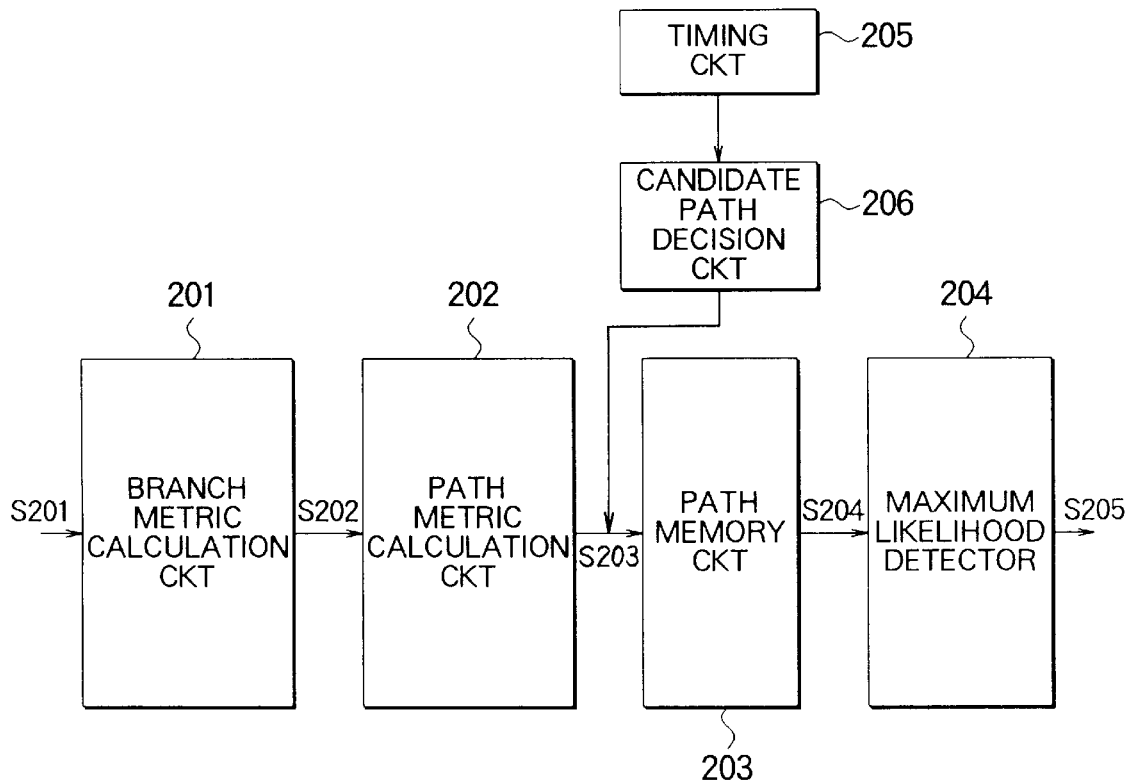
FIG. 7 is a block diagram of a decoder which is used in combination with the coder illustrated in FIG. 5 and which is operable in accordance with the maximum likelihood decision rule.
FIG. 8 shows a table for use in describing operation of a part of the decoder illustrated in FIG. 7.

Referring to FIG. 7, a decoder is for use in the data communication system according to the preferred embodiment of this invention and is communicable with the coder illustrated in FIG. 5. The illustrated decoder is supplied with the convolution codes as a sequence of reception bits to produce a sequence of decoded bits which is a reproduction of the input bits Sin illustrated in FIG. 5. In the illustrated example, the decoder carries out Viterbi decoding as maximum likelihood decoding. This shows that the decoder is operable in accordance with a maximum likelihood decision rule.

In order to execute the Viterbi decoding, the illustrated decoder comprises a branch metric calculation circuit 201, a path metric calculation circuit 202, a path memory circuit 203, and a maximum likelihood detector 204, like in FIG. 2 Specifically, the branch metric calculation circuit 201 calculates branch metrics representative of correlation values between the reception codes and candidate codes while the path metric calculation circuit 202 calculates path metrics, in a manner to be described later. Survived paths are memorized into the path memory circuit 203. The maximum likelihood detector 204 executes maximum likelihood detection to detect, in accordance with the maximum likelihood decision rule, the decoded bit sequence which is representative of the results of the maximum likelihood detection.

Herein, it is assumed that the convolution codes Yr are received by the decoder as the reception codes S201 which might include an error signal. At any rate, a combination of the reception code and the error signal may be assumed to be composed of n bits, where n is 1, 2, . . . . In the illustrated example, n is equal to four.

Referring to FIG. 8, the branch metric calculation circuit 201 (FIG. 7) calculates the correlation values between the reception codes, namely, the convolution codes Yr and the candidate codes Xr in accordance with a calculation matrix illustrated in FIG. 8. In FIG. 8, the correlation values are represented by Hamming distances between the reception codes Yr and the candidate codes Xr.

Figure 9:
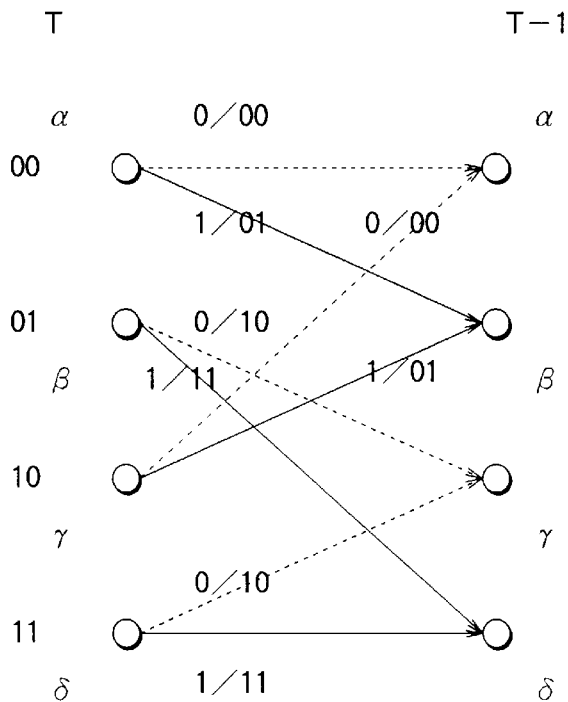
FIG. 9 is a trellis diagram for use in describing another operation of the decoder illustrated in FIG. 7.

Referring to FIG. 9, description will be made in detail about the path metric calculation circuit 202 illustrated in FIG. 7. In FIG. 9, the path metric calculation circuit 202 adds branch metric values calculated at a time instant T to branch metric values calculated at a previous time instant T−1 so as to obtain results. The results are compared with one another to select maximum likelihood sequences at the respective nodes or states. Thus, the path metric calculation circuit 202 repeatedly executes addition, comparison, and selection and may be referred to as an ACS circuit.

As shown in FIG. 9, when the states α, β, τ, and δ at the time instant T are shifted to the states α, β, τ, and δ at the time instant (T-1), the "0" or the "1" are added. After calculation of the path metrics, the path memory circuit 203 memorizes, in accordance with the trellis diagram, survived paths specifying previous paths which are allowed to pass therethrough until the time instant T.

In addition, the path memory calculation circuit 203 is operable in cooperation with a timing circuit 205 and a candidate path decision circuit 206 so as to refer to the predefined data bits inserted at every (q+1)-th bit, namely, at every fourth bit and selects the path metrics S203 determined from the predetermined data bits. More specifically, the survived paths are selected as selected survived paths from the path metrics by the use of the timing circuit 205 and the candidate path decision circuit 206. Subsequently, the selected survived paths are sent to the path memory circuit 203 to be memorized therein and are therefore transmitted to the maximum likelihood detector 204 in the form of the path metric values S204. The maximum likelihood detector 204 carries out the maximum likelihood detection in response to the path metric values S204 to produce the decoded codes S205 At any rate, a combination of the path metric calculation circuit 202, the timing circuit 205, and the candidate path decision circuit 206 may be referred to as a path calculation circuit.

In order to evaluate the above-mentioned system, it is assumed that the path memory circuit 203 (FIG. 7) has a memory capacity of twice the constraint length and that three error bits take place within twelve bits, namely, six codes like in FIGS. 3 and 4. Moreover, a single bit of the predetermined data signal is assumed to be inserted for three bits of the input bits, as illustrated in FIG. 6.

In this event, the decoder illustrated in FIG. 7 selects the paths depicted at real lines in FIG. 9, as maximum likelihood survived paths calculated for the path metrics shown in FIG. 9 and produces the decoded signals or bits.

Figure 10:
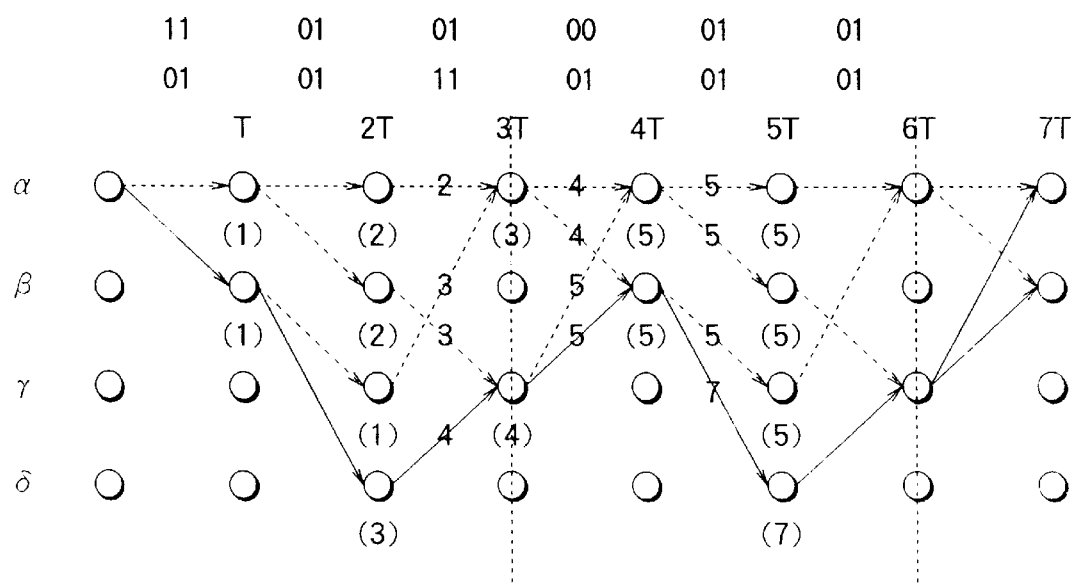
FIG. 10 is another trellis diagram for use in describing a further operation of the decoder illustrated in FIG. 7.

According to the present invention, the decoded bits are produced by selecting the paths illustrated in FIG. 4(A) when a communication line is not deteriorated in quality. As a result, no error takes place in the decoded bits, like in the conventional decoder. Furthermore, even when three error bits are included in the reception bits, paths appearing at a third time instant 3T are reduced to four paths, as illustrated in FIG. 10. In FIG. 10, the numbers in parentheses are indicative of those coincidence numbers between the candidate signals and the path selected signals and which are successively added at every stage.

On the other hand, the conventional decoder take eight paths which appear at the third time instant 3T, as shown in FIG. 4(B).

From this fact, it is readily understood that the paths which appear at the third time instant can be reduced from eight paths to four paths. This is because the decoder previously knows that each of the predetermined data bits takes "0" or "1". Thus, the paths which are used for selecting the maximum likelihood path can be reduced in number. In the illustrated example, the paths can be reduced to a half of the conventional paths. As a result, a probability of selecting a wrong survived path can be decreased to ½.

Inasmuch as the predefined data signal is previously included in the reception bits, the maximum likelihood decoding method according to this invention can select paths determined by the predefined data signal to some extent.

Therefore, it is possible to avoid a reduction of an ability of correcting errors and to make a memory capacity of the path memory circuit small While this invention has thus far been described in conjunction with a preferred embodiment thereof, it will readily be possible for those skilled in the art to put this invention into practice in various other manners. For example, an insertion time interval of each bit of the predefined data signal may be controlled, although a single bit is inserted for three input bits and may be selected in consideration of a trade-off relationship between the reduction of the coding rate and the error correction. A set of two or three bits of the predefined data signal may be inserted into the input bits, although the single bit of the predefined data signal is inserted bit by bit. In this event, such predefined data signal might be successively added within the input bits

What is claimed is:

1. A method of correcting an error which occurs in a sequence of reception codes, comprising the steps of:

receiving, as said reception code sequence a sequence of coded signals which conveys a combination of a sequence of transmission signals and a predefined signal, said predefined signal and said transmission signal sequence being composed of at least one predefined bit and a sequence of transmission bits, said predefined signal bit being inserted at every (q+1)th bit of the transmission bits to form said combination of the transmission and the predefined signals, where q is an integer not smaller than unity; and correcting, by the use of a maximum likelihood decision rule, the error of said reception code sequence with reference to said predefined signal to reproduce said transmission signal sequence error corrected, wherein said at least one predefined bit and the number of q are equal to unity and three, respectively.

2. A method as claimed in claim 1, wherein said reception coded signal sequence is subjected to convolution coding.

3. A method of coding a sequence of transmission signals into a sequence of transmission codes, comprising the steps of:

inserting a predefined signal into said transmission signal sequence to form a sequence of combined signals;

carrying out convolution coding of said combined signal sequence into a sequence of convolution codes; and transmitting the convolution codes as said transmission code sequence;

wherein said predefined signal and said transmission signal sequence are composed of at least one predefined bit and a sequence of transmission bits, respectively, said at least one predefined bit is inserted into said transmission bit sequence at every (q+1)-th bit of the transmission bit sequence, where q is an integer not smaller than unity, and the number of q is equal to three while said at least one predefined bit is a single bit.

4. A data communication system comprising a coder operable in response to a sequence of transmission signals to produce a sequence of transmission codes and a decoder supplied with the transmission code sequence as a sequence of reception codes to produce a sequence of decoded signals representative of a reproduction of said transmission signal sequence, said coder comprising:

combining means supplied with the transmission signal sequence and a predefined signal for combining the transmission signal sequence with the predefined signal at every predetermined transmission signals to Produce a sequence of combined signals;

coding means for carrying out convolution coding of said combined signal sequence to Produce a sequence of convolution codes; and means for transmitting said convolution codes as said transmission code sequence to said decoder;

said decoder being supplied with said transmission code sequence as a sequence of reception codes which convey the convolution code sequence and which might includes an error and comprising:

decoding means supplied with the reception code sequence operable in accordance with a maximum likelihood decision rule for decoding the reception code sequence into a sequence of decoded codes error corrected with reference to said predefined signal; and detecting means for detecting the transmission signal sequence from said decoded code sequence;

said decoding means further comprising:
 branch metric calculation means for successively calculating branch metrics representative of correlations between said reception codes and candidate codes previously prepared in said branch metric calculation means at a sequence of time instants;

path metric calculation means for successively calculating maximum likelihood oath metrics from said branch metrics to determine a survived path with reference to said predefined signal; and a path memory for memorizing said survived path to produce the decoded code sequence;

said path metric calculation means further comprising:
 a timing generator for generating the predefined signal and a timing signal which indicates the time instant of said predefined signal;
 a candidate path decision circuit for sleeting candidate paths which depend on said predefined signal; and
 calculating means for calculating said survived path from said maximum likelihood path metrics, the predefined signal, and the timing signal of the predefined signal.

* * * * *